(12) United States Patent
Wu et al.

(10) Patent No.: US 7,351,609 B2
(45) Date of Patent: Apr. 1, 2008

(54) METHOD FOR WAFER LEVEL PACKAGE OF SENSOR CHIP

(75) Inventors: Enboa Wu, Taipei (TW); Rou-Ching Yang, Taipei (TW)

(73) Assignee: National Taiwan University, Taipei (TW)

( * ) Notice: Subject to any disclaimer, the term of this patent is extended or adjusted under 35 U.S.C. 154(b) by 195 days.

(21) Appl. No.: 11/385,882

(22) Filed: Mar. 22, 2006

(65) Prior Publication Data

US 2007/0224728 A1  Sep. 27, 2007

(51) Int. Cl.
  *H01L 21/00* (2006.01)
(52) U.S. Cl. .................. 438/106; 257/E21.577
(58) Field of Classification Search ......... 438/106
  See application file for complete search history.

(56) References Cited

U.S. PATENT DOCUMENTS

6,396,043 B1  5/2002  Glenn et al.
6,528,857 B1  3/2003  Glenn et al.
6,646,289 B1  11/2003  Badehi

*Primary Examiner*—Michael Lebentritt
*Assistant Examiner*—Elias Ullah
(74) *Attorney, Agent, or Firm*—Birch, Stewart, Kolasch & Birch, LLP (57) ABSTRACT

A method for wafer level package (WLP) of sensor chips is provided, including the steps of: providing a wafer, the wafer including a plurality of die regions, each the die region on a first surface of the wafer comprising an active area and a pad surrounding the active area; bounding a transparent protective layer to the first surface of the wafer; forming a stress buffer on a second surface of the wafer; using etching or laser drill to form a via hole at the location between two neighboring die regions through the stress buffer and the wafer to expose the pad or a conductive line between two neighboring pads; and forming a plurality of bump electrodes on the stress buffer for electrical connection to the pads through the via holes. The method can prevent pollution of the die, improve the convenience of package, reduce the manufacture cost, increase the package reliability, and solve the stress problem caused by attaching the die directly to the PCB.

38 Claims, 10 Drawing Sheets

METHOD FOR WAFER LEVEL PACKAGE OF SENSOR CHIP

BACKGROUND OF THE INVENTION

1. Field of the Invention

The present invention generally relates to a method for semiconductor chip packaging, and more specifically to a method for wafer level package of sensor chip.

2. The Prior Arts

When the integrated circuit (IC) is designed and fabricated, the IC must be packaged. The purposes of packaging is to connect the IC with the other electrical component as to accomplish (1) power transmission, (2) electrical signal transmission, (3) provision of heat dissipation, and (4) carrying and protecting IC.

As the arrival of customized electronic products, single chip products, and portable of audiovisual products, the modern demands of thin, light, short, small, new speedy, inexpensive, and environmental friendly products has driven the packaging technology going through a rapid change. At present, the chip scale package (CSP) is widely adopted.

Conventional IC packaging is to dice the wafer, and the die are placed on conductive lines and glued with silver glue. Then, the contact points on the die are connected by thin gold wire to inner pins of the conductor frame to connect to outside through the conductor frame. Next, the epoxy process is used to seal the die to prevent humidity. Finally, the outer pins of the conductor frame are electroplated with the alloy of Zn and Pb so that the IC can be easily attached to the printed circuit board (PCB). After the seal printing, cutting the pins, formation and frame removal, a complete IC component is completed. Therefore, the conventional IC is packaged at the die level. On the other hand, wafer-level package (WLP) is different from the conventional packaging process. In WLP, the entire wafer is packaged, and the packaged wafer is then diced. The size of the die using WLP is about the same size of the unpackaged die.

The sensor chips of the opto-electronic image sensors, such as charge coupled device (CCD), complementary metal-oxide semiconductor (CMOS) emphasize on receiving EM radiation signals. In general, the surface of the chip includes an active area for receiving EM signals, and an electrical pin, such as a pad, surrounding the active area. When the EM signal reaches the active area, the chip will transform the optical signal of the EM wave into electrical signal, and transmitted through the pad.

The aforementioned sensor chips are usually packaged with a wire bonding technology for electrical connection, and then sealed inside a glass with a supporting structure for protection and light penetration. As this type of packaging process requires a highly clean environment (Class 100), the costs of the facility and operation are both high. In addition, as the volume of the packaging structure is sizeable, the size of the packaged sensor chip cannot be effectively reduced. U.S. Pat. No. 6,396,043 disclosed a flip chip package method using glass as a substrate and light penetration layer to reduce the thickness of the packaged structure and overcome the limitation of the light penetration direction in the flip chip package. However, this method has two drawbacks. One is the area of the packaged chip is still large, and the other is the chip need to be packaged individually.

U.S. Pat. No. 6,528,857 disclosed a package structure with a bump of the chip size. The package structure includes an image sensor chip, whose upper surface includes an active area with a pad surrounding the active area, a window supported by a window support on the sensing area, a step-up ring (multi-layer laminated structure) formed on the upper surface of the image sensor chip and located between sensing area and the pad, and a conductive line (external line) formed on the step-up ring to connect to the pad on the upper surface of the image sensor chip through wire bonding. The signal can go through the pad, the wire bonding, and the external line to reach the solder ball. Other than wire bonding, the patent also disclosed a flip chip packaging method by using the bump to connect the inner line beneath the step-up ring and the pad of the chip so that the signal can go through the pad, the bump, the inner line, the hole, the external line to reach the solder ball. Finally the signal is transmitted to the PCB by the surface mount technology (SMT). With this structure, the size of the packaged image sensor chip is about the original size of the image sensor chip before packaging. The patent pointed out that the packaging method is suitable for batch processing, and applicable to a package structure for an array. After ball attachment to the wafer, the wafer is diced. The drawbacks of this method include the thickness of the final package, the complexity of the process and the bump is prone to damage.

U.S. Pat. No. 6,646,289 disclosed a glass layer WLP structure similar to a sandwich. The front surface of the wafer is pressed on an insulation cover plate (glass plate), and the back surface of the wafer is ground. After the thinning of the wafer, the wafer goes through a conventional etching process to form individual separate dice. Then, the glue is applied to glue the second insulation cover layer (glass plate) to the back surface of the wafer so that the wafer is packaged between two insulation layers. Next, the special cutting tool is used to cut a v-shaped trench on the second insulation layer between two neighboring dice. The depth of the trench is just enough to expose the edge of the pad on the wafer. A layer of metal conductive layer is formed in the v-shaped trench so that the T-contact is extended to the second insulation layer. After the redistribution and the solder ball planting, the wafer is diced to complete the package structure. The packaging method disclosed in U.S. Pat. No. 6,646,289 is a typical WLP method. Its drawbacks include high cost (two glass layers and special cutting tool), difficulty of cutting precision, high error rate, pollution during cutting, and the bump electrode prone to breakage.

SUMMARY OF THE INVENTION

The present invention has been made to overcome the aforementioned drawback of packaging methods. The primary object of the present invention is to provide a wafer level package (WLP) method of sensor chips for mass production and reducing the packaging cost.

The WLP method of the present invention includes the steps of:

(a) providing a wafer, the wafer including a plurality of die regions, each die region on the first surface of the wafer including an active area and a pad surrounding the active area;

(b) bounding a transparent protective layer to the first surface of the wafer;

(c) forming a stress buffer on the second surface of the wafer;

(d) using etching or laser drill to form a via hole at the location between two neighboring die regions through the stress buffer and the wafer to expose the pad or the conductive line between two neighboring pads; and (e) forming a plurality of bump electrodes on the stress buffer for electrical connection to the pads through the via holes The via holes of the present invention can be formed by wet etching (such as, chemical etching), dry etching (such as, reactive ion etching (RIE), inductively coupled plasma reactive ion etching (ICP)), or laser drill. The present invention does not use the special cutting tool required by the U.S. Pat. No. 6,646,289. Therefore, the present invention is simpler, precise, and inexpensive to produce in comparison. In addition, the present invention also avoids the pollution caused by cutting.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
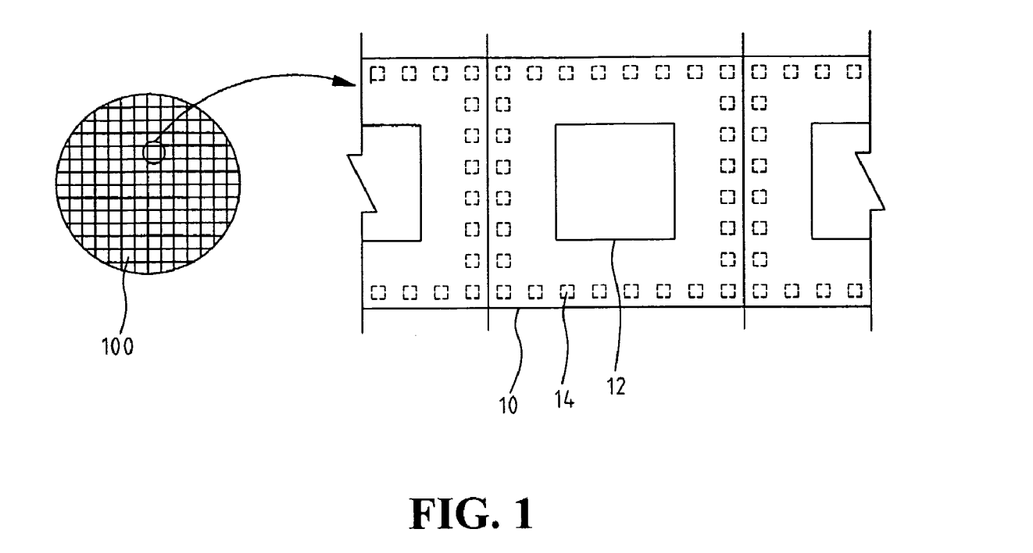
FIG. 1 shows a schematic view of the wafer and die regions of the package method of sensor chip according to the present invention.
Figure 2:
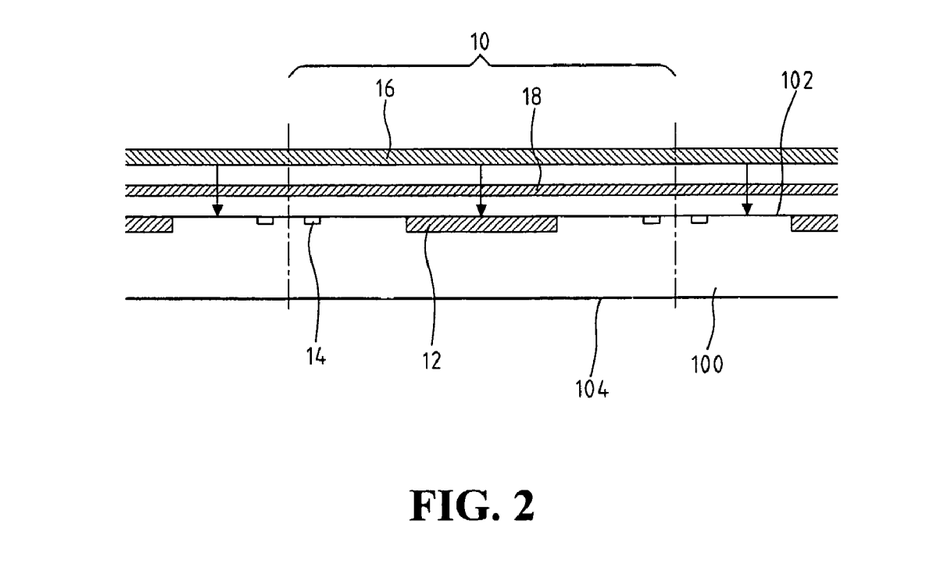
FIG. 2 shows a schematic view of the bounding between the wafer and the transparent protective layer of the package method of sensor chip according to the present invention.

Refer to FIG. 1 and FIG. 2. The present invention discloses a wafer level package (WLP) method of sensor chip. First, a first surface 102 of a wafer 100 including a plurality of die regions 10 is bound to a transparent protective layer 16 with a glue 18. Each die region 10 of first surface 102 of wafer 100 includes an active area 12 and a pad 14 surrounding active area 12. Pad 14 is for electrical connection so that active area 12 can be electrically connected to the outside of die region 10 through pad 14. First surface 102 of wafer 100 refers to the side of wafer 100, which includes active areas 12. Transparent protective layer can be made of glass, crystal, sapphire or other conventional materials suitable for insulator allows for radiation penetration, but it is preferably to use glass. When used as spectrum filter, transparent protective layer 16 can be colored or dyed. On the other hand, at least one surface of transparent protective layer 16 is bound to a dichroic, a light grid (grating), or a wave filter layer for filtering specific wavelength.

The glue used in the present invention can be epoxy, but not limited to. It is preferably that both transparent protective layer 16 and glue 18 are both radiation penetrable.

At the beginning of the packaging process, transparent protective layer 16 covers and protects first surface 102 of wafer 100 so that the subsequent packaging steps do not demand critically clean environment. In addition, when wafer 100 requires rework and re-wired, transparent protective layer 16 can provide complete protection to active areas 12 against pollution.

Figure 3:
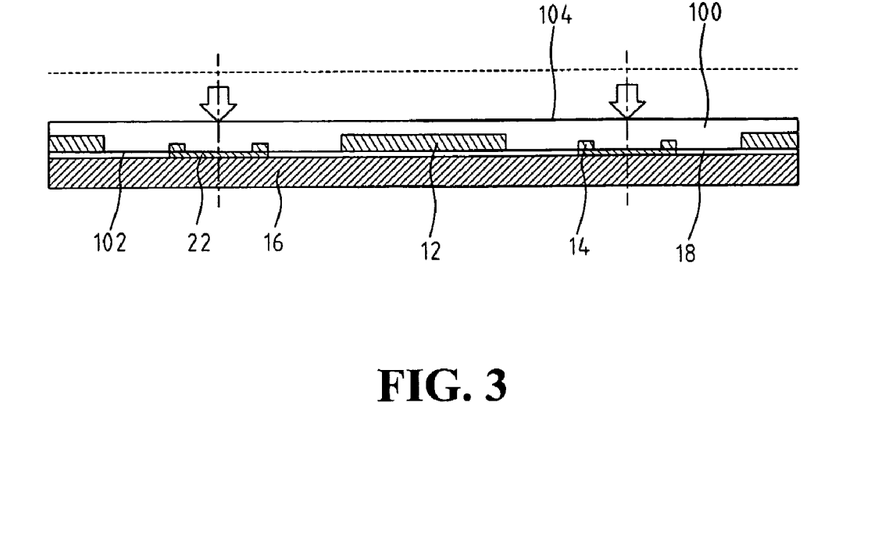
FIG. 3 to FIG. 15 show the schematic views of the steps of the package method of sensor chip according to the present invention.

FIG. 3 shows another embodiment of the present invention. Before wafer 100 is bound to transparent protective layer 16, a conductive line 22 is placed between pads 14 of two neighboring die regions 10, and glued to transparent protective layer 16 with glue 18. Conductive line 22 can be made of any conductive material that allows pad 14 to be electrically connected to the outside of die region 10.

Figure 4:
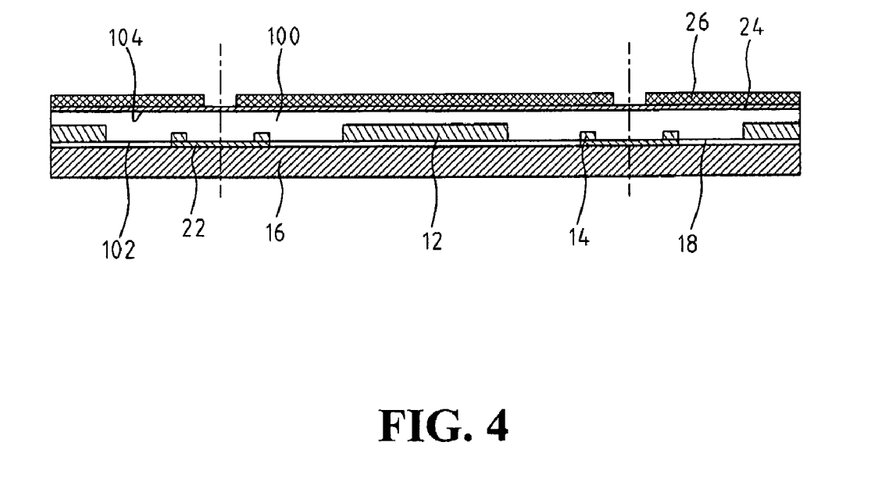
Figure 5:
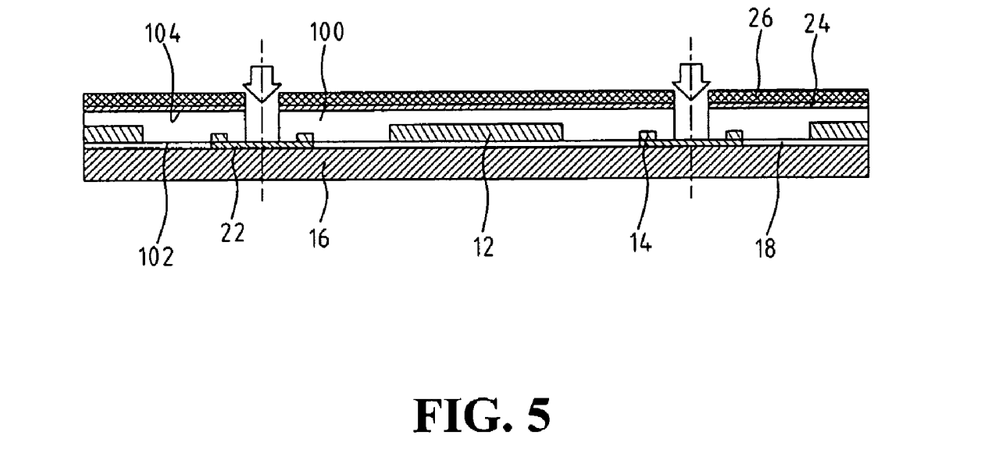
Figure 15:
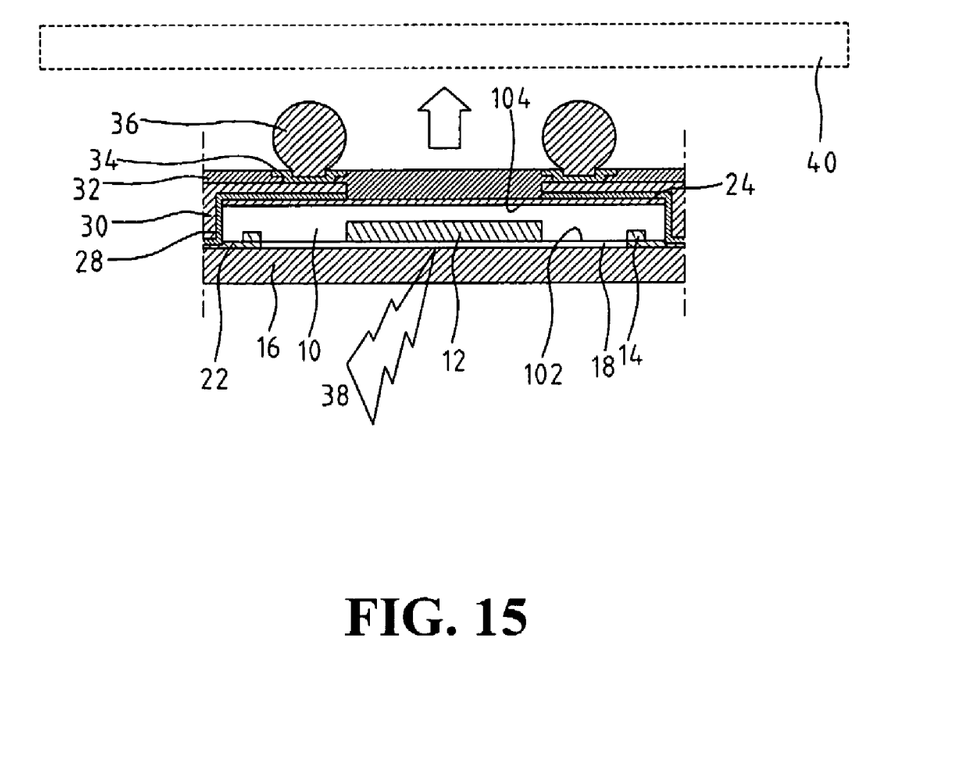
Figure 16A:
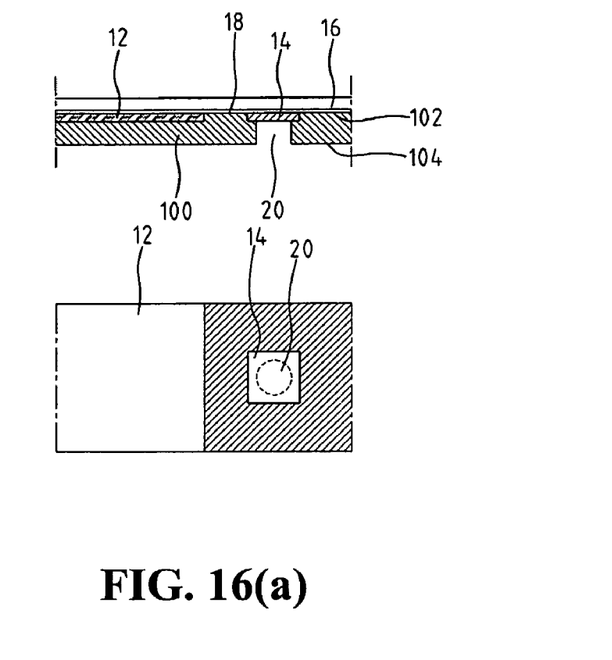
FIG. 16(a) shows a schematic view of an embodiment of via hole of the package method of sensor chip according to the invention.
Figure 16B:
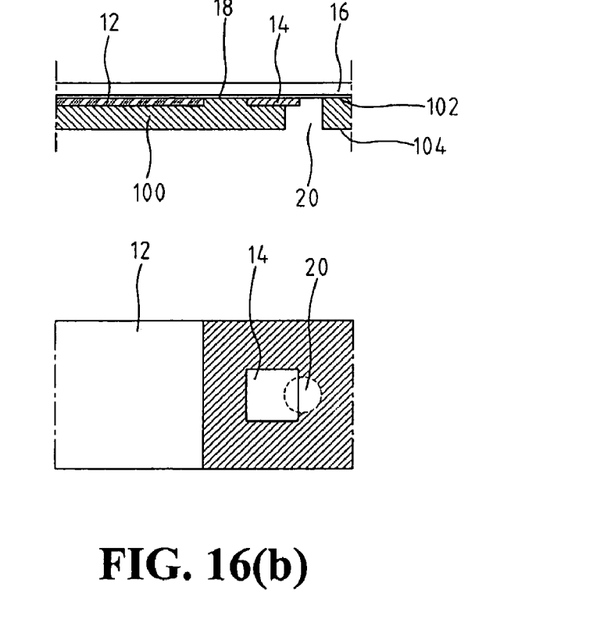
FIG. 16(b) shows a schematic view of another embodiment of via hole of the package method of sensor chip according to the invention.
Figure 16C:
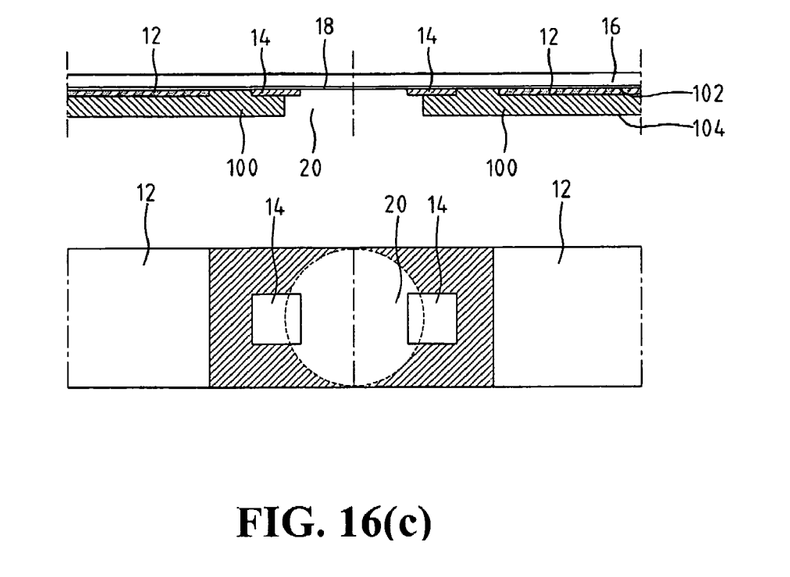
FIG. 16(c) shows a schematic view of another embodiment of via hole of the package method of sensor chip according to the invention.
Figure 16D:
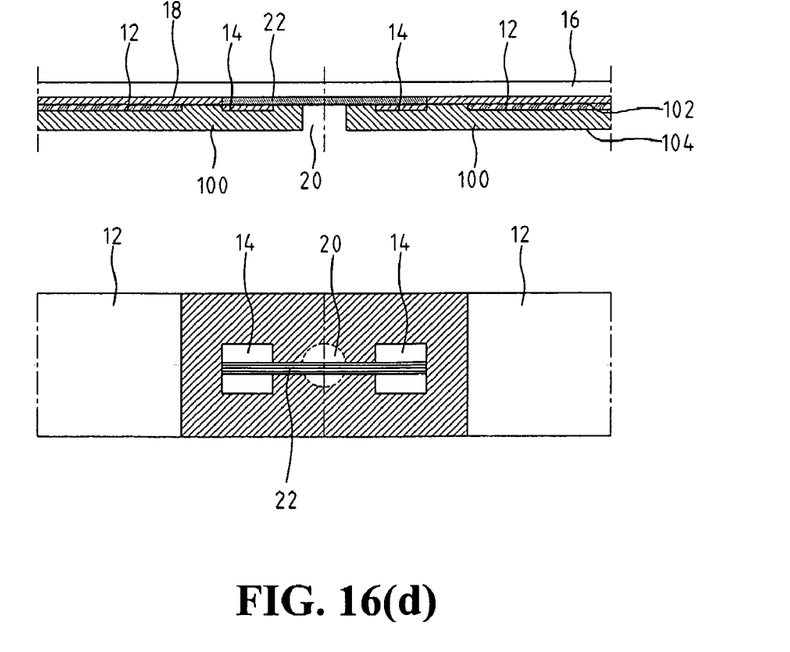
FIG. 16(d) shows a schematic view of yet another embodiment of via hole of the package method of sensor chip according to the invention.

The present invention uses the structure including conductive line 22 as an embodiment (FIG. 16(d)) to explain the subsequent packaging process. The following description refers to FIG. 3 to FIG. 15, which show the subsequent steps of the method for WLP of sensor chip of the present invention. As described earlier, to reduce the thickness of the packaged die, a second surface 104 of wafer 100 can be ground to reduce the thickness to, say, 100 um, after wafer 100 and transparent protective layer 16 are bound. Then, a first stress buffer layer 24 is formed on second surface 104 of wafer 100, followed by a step of defining the locations of via holes 20 between two neighboring regions 10 on first stress buffer layer 24 using a photo-resistor 26 of a lithographic process, as shown in FIG. 4. The forming of first stress buffer layer 24 on second surface 104 can be achieved by a spin coating technique. First stress buffer layer 24 can be made of materials that are capable to alleviate the stress caused by the difference between the thermal expansion coefficients of the die and the substrate (such as organic substrate). Therefore, the following materials, including, but not limited to, polyimide (PI), benzocyclobutane (BCB), silicon, or other polymers can all be used to form first stress buffer layer 24. After photo-resistor 26 is in place, via holes 20 are formed using an etching technique to penetrate first stress buffer layer 24 and wafer 100 so that pads 14 or conductive line 22 between two neighboring pads 14 are exposed, as shown in FIG. 5. The etching technique to form via holes 20 can be wet etching, dry etching, such as RIE and ICP, or laser drill, but not limited to.

Figure 6:
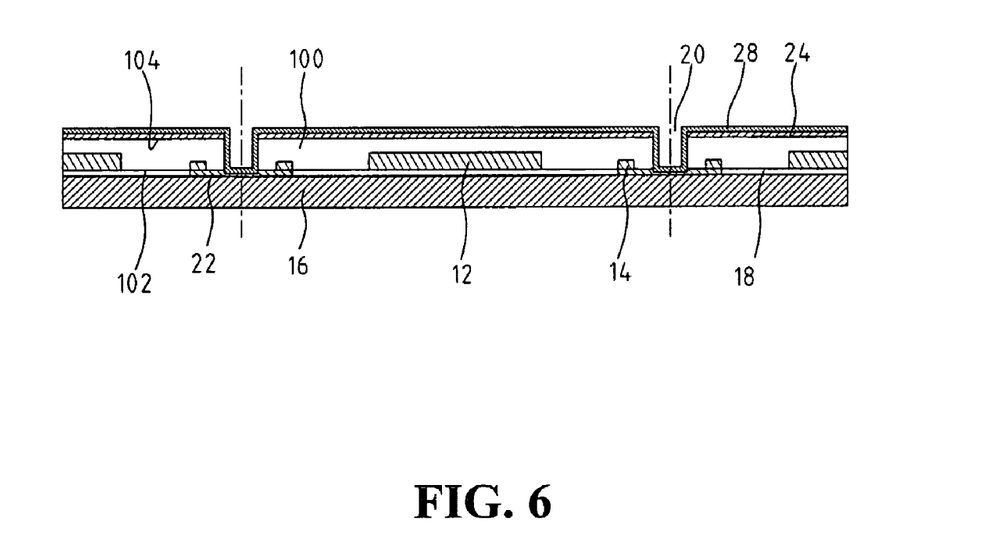
Figure 7:
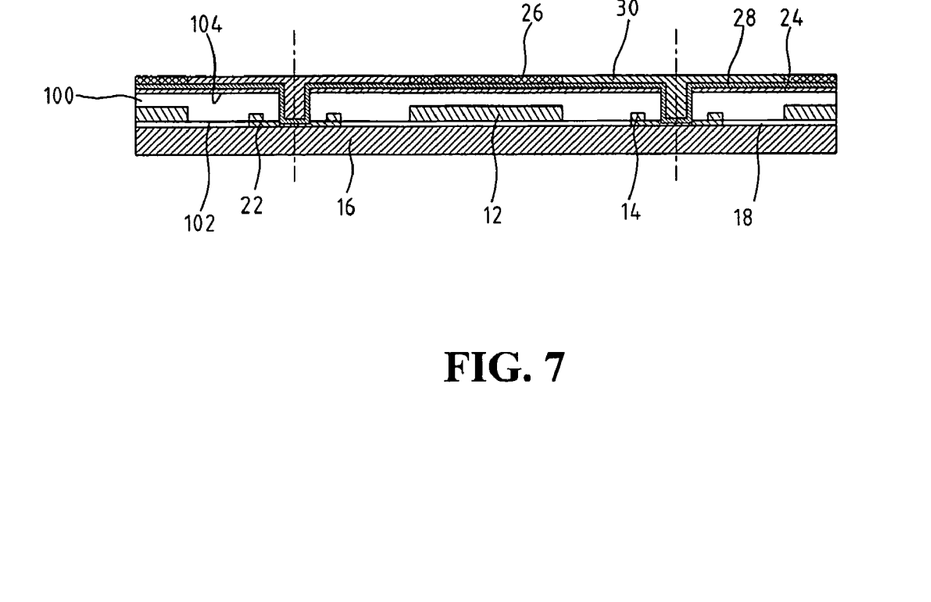
Figure 8:
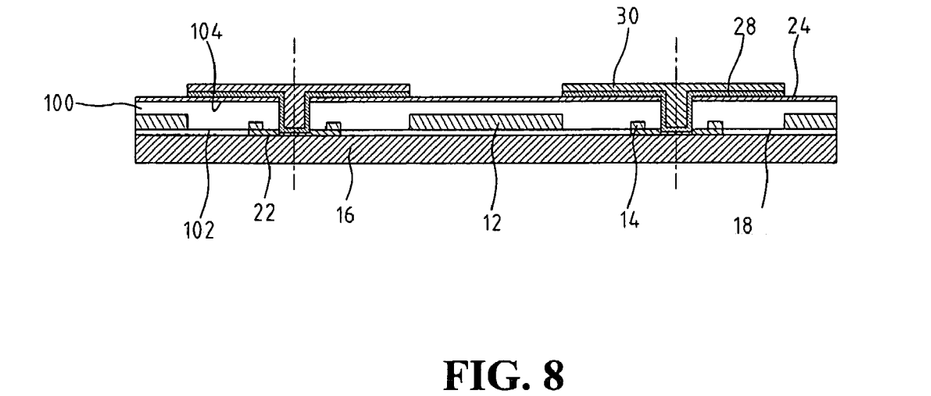
Figure 9:
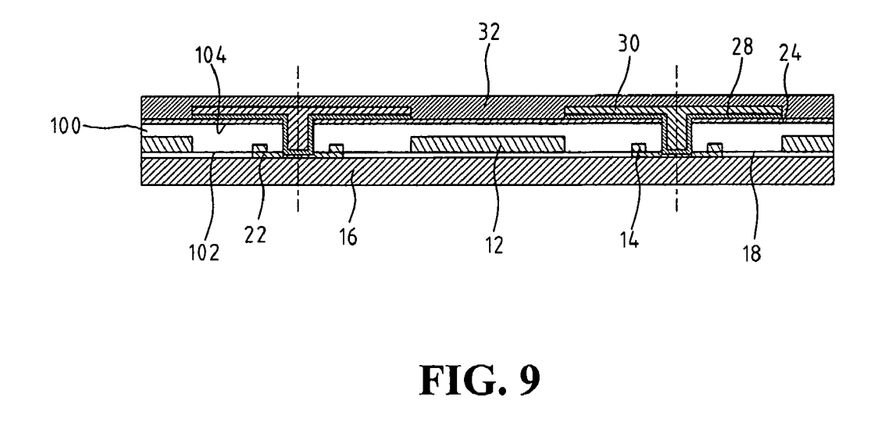

Then, an insulation layer (now shown) is formed on the inner wall of via holes 20. After the removal of photo-resistor 26, a first conductive material 28, such as Ti or Cu, is formed using a sputtering electroplating technique, as shown in FIG. 6. Again, photo-resistor 26 is used to define the location of the wiring, and a second conductive material 30, such as Cu, is electroplated and fills via holes 20 for increasing the thickness of the conductive material and routing, as shown in FIG. 7. FIG. 8 shows the removal of photo-resistor 26 and extra first conductive material 28 to form the wiring on first stress buffer layer 24. FIG. 9 shows the forming of a second stress buffer layer 32 to cover the wiring formed by second conductive material 30 on first stress buffer layer 24. The forming of second stress buffer layer 32 can be achieved by a spin coating technique. Second stress buffer layer 32 can be made of materials that are capable to alleviate the stress caused by the difference between the thermal expansion coefficients of the die and the substrate (such as organic substrate). Therefore, the following materials, including, but not limited to, polyimide (PI), benzocyclobutane (BCB), silicon, or other polymers can all be used to form second stress buffer layer 32.

Figure 10:
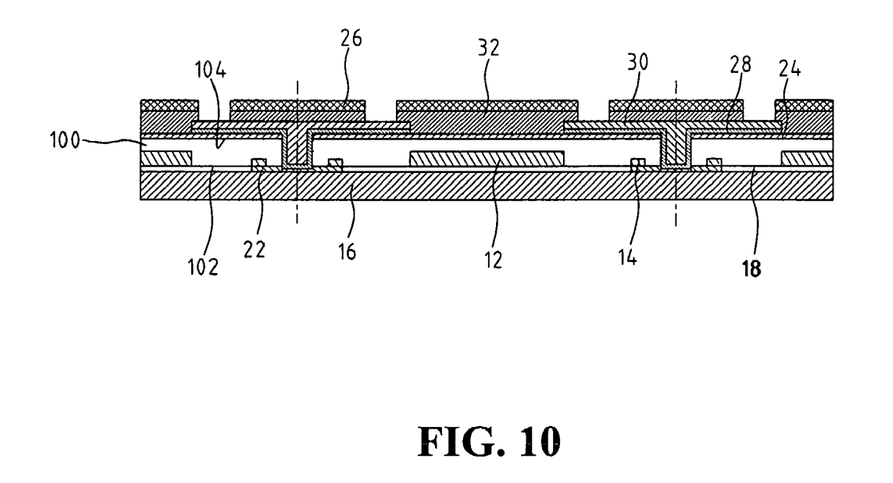
Figure 11:
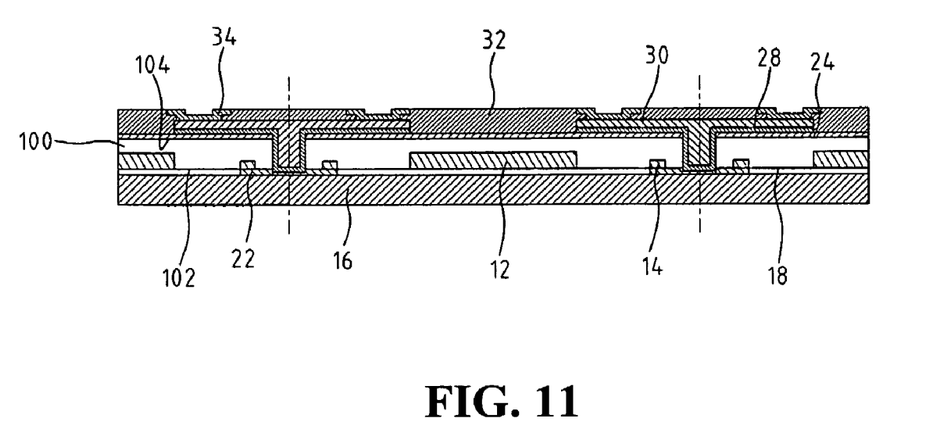

Photo-resistor 26 is again used to define the locations of under bump metallurgy (UBM) 34, and an etching technique is applied on second stress buffer layer 32 to expose the second conductive material 30 used as wiring, as shown in FIG. 10. FIG. 11 shows the removal of photo-resistor 26 and the forming of UBM 34. UBM 34 is electrically connected to second conductive material 30.

For those with ordinary skills in the technology, it can be understood that the conductive material used in the present invention can include many varieties, as long as the electrical connection can be provided, such as Ti, Cu, Cr, Au, Al, Ni, V, Ag and so on. The present invention can use the following techniques, but not limited to, including sputtering, electroplating, evaporation and electroless plating.

Figure 12:
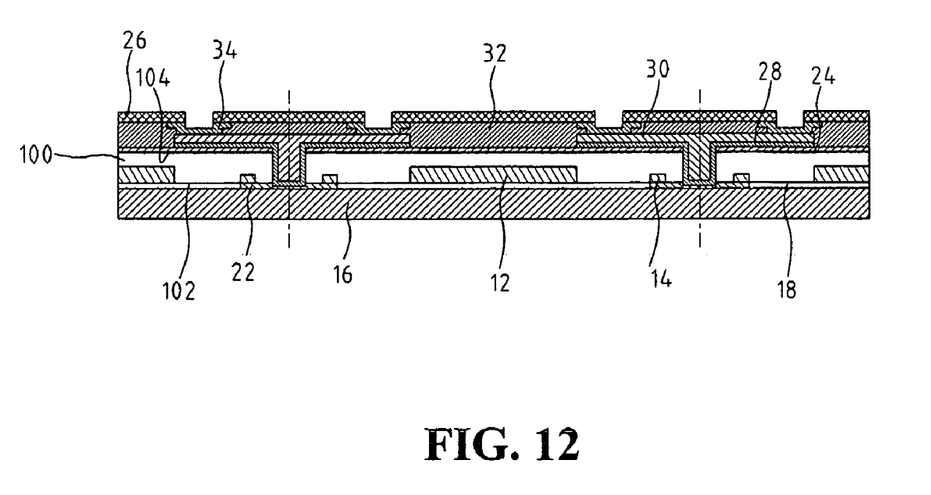
Figure 13:
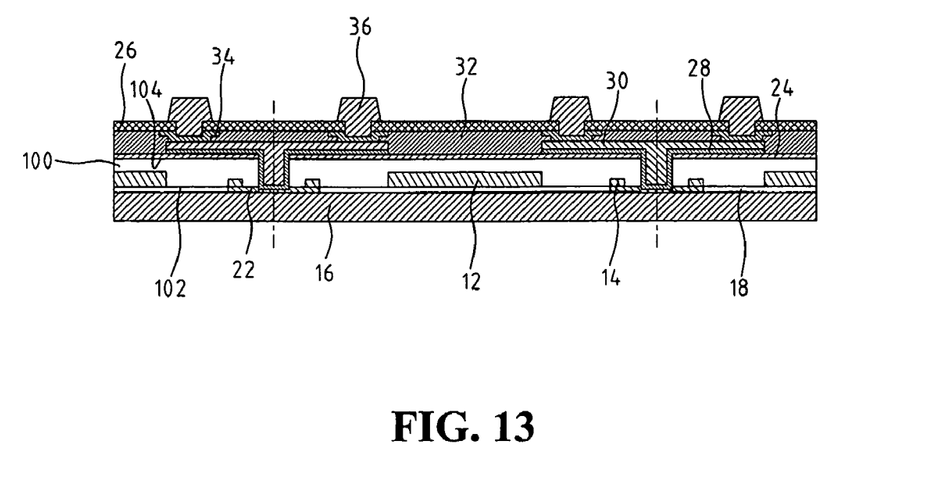
Figure 14:
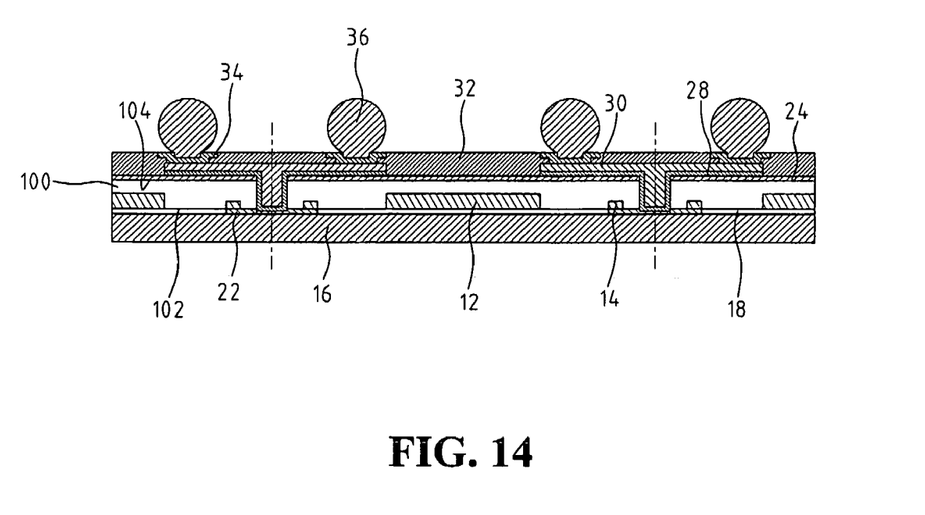

FIG. 12 to FIG. 14 show the use of photo-resistor 26 to define the locations of solder bumps 36, and forming solder bump 36 on UBM 34. Finally, photo-resistor 26 is removed, and a reflow technique is applied. Solder bumps 36 can be made of high temperature Sn—Pb alloy, low temperature Sn—Pb alloy, or Pb-free solder ball, but not limited to. In addition, the techniques for forming solder bumps 36 on UBM 34 include evaporation, electroplating and printing. The present invention does not impose any limitation on the choice of the techniques.

FIG. 15 shows the dicing of wafer 100 into die regions 10, and completes the package of the dice. With this structure of the present invention, the front side receives EM radiation 38, and active areas 12 of the die will transform EM radiation 38 into electrical signal, which is transmitted through pad 14, conductive line 22, via hole 20, first conductive material 28 (for wiring), second conductive material 30, and solder bump 36 to reach PCB 40 bound to the back of the die. Because the back side of the die of the present invention includes solder bump 36, the die can be easily bound to PCB 40.

The following describes different embodiments of the locations of via holes 20.

FIG. 16(a) shows a first embodiment of via hole 20 of the present invention. In this embodiment, via hole 20 formed on second surface 104 of wafer 100 is located beneath pad 14. The area of via hole 20 can be either greater or smaller than the size of pad 14 to expose pad 14. The figure shows the size of via hole 20 is smaller than the size of pad 14. Solder bump 36 on the back side of the die is electrically connected to pad 14 through via hole 20.

FIG. 16(b) shows another embodiment of via hole 20 of the present invention. In this embodiment, via hole 20 formed on second surface 104 of wafer 100 is surrounding pad 14 to expose a part of pad 14. Solder bump 36 on the back side of the die is electrically connected to pad 14 through via hole 20.

FIG. 16(c) shows another embodiment of via hole 20 of the present invention. In this embodiment, via hole 20 formed on second surface 104 of wafer 100 is located between pads 14 of two neighboring die regions to expose a part of or entire pad 14. Solder bump 36 on the back side of the die is electrically connected to pad 14 through via hole 20.

FIG. 16(d) shows yet another embodiment of via hole 20 of the present invention. In this embodiment, via hole 20 formed on second surface 104 of wafer 100 is located between pads 14 of two neighboring die regions. However, instead of exposing pads 14, via hole 20 exposes conductive line 22 between two neighboring pads 14. The figure shows the size of via hole 20 is smaller than the size of pad 14. Solder bump 36 on the back side of the die is electrically connected through via hole 20 to conductive line 22, which is connected to pad 14. The aforementioned package process uses this embodiment as an example.

In addition, because the structure of the present invention includes a stress buffer layer, it can alleviate the stress caused by the difference between the thermal expansion coefficients of the die and the substrate, such as organic substrate. It can also serve the purpose of maintaining the electrical connection between the die and the substrate.

The via hole of the present invention can be formed by etching or laser drill. The package method of the present invention does not require many complicated tooling as in conventional package methods. Therefore, it is possible to design different masks for different products for forming via holes of different size and shape, whose depth can also be controlled by etching or laser drill. This leads to a better yield rate and is easier to apply when compared to the special tooling used by conventional techniques. Furthermore, because no special tools are required in the present invention, the manufacture cost is lower. The WLP method of sensor chip can prevent pollution, improve the convenience of package and solve the stress problem caused by attaching the die directly to PCB.

In summary, the wafer level package method of the present invention includes transparent protective layers, stress buffer layers, and via holes. Therefore, the present invention can effectively avoid the aforementioned drawbacks encountered by conventional techniques. In other words, the present invention can prevent pollution of the die, improve the convenience of package, reduce the manufacture cost, increase the package reliability, and solve the stress problem caused by attaching the die directly to the PCB.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for wafer level package (WLP) of sensor chips, comprising the steps of:
    (a) providing a wafer, the wafer including a plurality of die regions, each die region on a first surface of the wafer comprising an active area and a pad surrounding the active area;
    (b) bounding a transparent protective layer to the first surface of the wafer;
    (c) forming a stress buffer on a second surface of the wafer;
    (d) using an etching technique to form a via hole at the location between two neighboring die regions through the stress buffer and the wafer to expose the pad or a conductive line between two neighboring pads; and
    (e) forming a plurality of bump electrodes on the stress buffer for electrical connection to the pads through the via holes.

2. The method as claimed in claim 1, wherein the etching technique is a wet etching technique.

3. The method as claimed in claim 2, where in the wet etching technique is a chemical etching technique.

4. The method as claimed in claim 1, wherein the etching technique is a dry etching technique.

5. The method as claimed in claim 4, wherein the dry etching technique is a reactive ion etching technique.

6. The method as claimed in claim 4, wherein the dry etching technique is an inductively coupled plasma reactive ion etching technique.

7. The method as claimed in claim 1, wherein the transparent protective layer is made of glass, crystal, sapphire, or a combination of the above.

8. The method as claimed in claim 1, wherein at least one surface of the transparent protective layer comprises a coated film.

9. The method as claimed in claim 1, wherein at least one surface of the transparent protective layer comprises a dichroic.

10. The method as claimed in claim 1, wherein at least one surface of the transparent protective layer comprises a light grid (grating).

11. The method as claimed in claim 1, wherein at least one surface of the transparent protective layer comprises a light wave filter layer.

12. The method as claimed as in claim 1, wherein the stress buffer layer is made of material selected from a group formed by PI, BCB, and silicon.

13. The method as claimed in claim 1, wherein the inside of the via hole further comprises a conductive material.

14. The method as claimed in claim 13, wherein the conductive material is selected from a group formed by Ti, Cu, Cr, Au, Al, Ni, V, and Ag.

15. The method as claimed in claim 13, wherein the conductive material is formed inside of the via hole with a sputtering technique.

16. The method as claimed in claim 13, wherein the conductive material is formed inside of the via hole with an electroplating technique.

17. The method as claimed in claim 13, wherein the conductive material is formed inside of the via hole with an evaporation technique.

18. The method as claimed in claim 13, wherein the conductive material is formed inside of the via hole with an electroless plating technique.

19. A method for wafer level package (WLP) of sensor chips, comprising the steps of:
  (i) providing a wafer, the wafer including a plurality of die regions, each die region on a first surface of the wafer comprising an active area and a pad surrounding the active area;
  (ii) placing a conductive line between the pads of two neighboring die regions;
  (iii) bounding a transparent protective layer to the first surface of the wafer;
  (iv) forming a stress buffer on a second surface of the wafer;
  (v) using an etching technique to form a via hole at the location between two neighboring die regions through the stress buffer and the wafer to expose the conductive line; and
  (vi) forming a plurality of bump electrodes on the stress buffer for electrical connection to the pads through the via holes and the conductive line.

20. The method as claimed in claim 19, wherein the etching technique is a wet etching technique.

21. The method as claimed in claim 20, where in the wet etching technique is a chemical etching technique.

22. The method as claimed in claim 19, wherein the etching technique is a dry etching technique.

23. The method as claimed in claim 22, wherein the dry etching technique is a reactive ion etching technique.

24. The method as claimed in claim 22 wherein the dry etching technique is an inductively coupled plasma reactive ion etching technique.

25. The method as claimed in claim 19, wherein the transparent protective layer is made of glass, crystal, sapphire, or a combination of the above.

26. The method as claimed in claim 19, wherein at least one surface of the transparent protective layer comprises a coated film.

27. The method as claimed in claim 19, wherein at least one surface of the transparent protective layer comprises a dichroic.

28. The method as claimed in claim 19, wherein at least one surface of the transparent protective layer comprises a light grid (grating).

29. The method as claimed in claim 19, wherein at least one surface of the transparent protective layer comprises a wave filter layer.

30. The method as claimed as in claim 19, wherein the stress buffer layer is made of material selected from a group formed by PI, BCB, and silicon.

31. The method as claimed in claim 19, wherein the inside of the via hole further comprises a conductive material.

32. The method as claimed in claim 31, wherein the conductive material is selected from a group formed by Ti, Cu, Cr, Au, Al, Ni, V, and Ag.

33. The method as claimed in claim 31, wherein the conductive material is formed inside of the via hole with a sputtering technique.

34. The method as claimed in claim 31, wherein the conductive material is formed inside of the via hole with an electroplating technique.

35. The method as claimed in claim 31, wherein the conductive material is formed inside of the via hole with an evaporation technique.

36. The method as claimed in claim 31, wherein the conductive material is formed inside of the via hole with an electroless plating technique.

37. A method for wafer level package (WLP) of sensor chips, comprising the steps of:
  (1) providing a wafer, the wafer including a plurality of die regions, each die region on a first surface of the wafer comprising an active area and a pad surrounding the active area;
  (2) bounding a transparent protective layer to the first surface of the wafer;
  (3) forming a stress buffer on a second surface of the wafer;
  (4) using laser drill to form a via hole at the location between two neighboring die regions through the stress buffer and the wafer to expose the pad or a conductive line between two neighboring pads; and
  (5) forming a plurality of bump electrodes on the stress buffer for electrical connection to the pads through the via holes.

38. The method as claimed in claim 37, further comprising a step of placing a conductive line between the pads of two neighboring die regions between the step (1) and the step (2).

* * * * *